United States Patent
Campi, Jr. et al.

(10) Patent No.: US 8,363,367 B2
(45) Date of Patent: Jan. 29, 2013

(54) ELECTRICAL OVERSTRESS PROTECTION CIRCUIT

(75) Inventors: John B. Campi, Jr., Westford, VT (US); Shunhua T. Chang, South Burlington, VT (US); Kiran V. Chatty, Williston, VT (US); Robert J. Gauthier, Jr., Hinesburg, VT (US); Junjun Li, Williston, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 530 days.

(21) Appl. No.: 12/632,015

(22) Filed: Dec. 7, 2009

(65) Prior Publication Data

US 2010/0246076 A1    Sep. 30, 2010

Related U.S. Application Data

(60) Provisional application No. 61/163,889, filed on Mar. 27, 2009.

(51) Int. Cl.
*H02H 9/00* (2006.01)
(52) U.S. Cl. .......................................................... 361/56
(58) Field of Classification Search ..................... 361/56
See application file for complete search history.

(56) References Cited

U.S. PATENT DOCUMENTS

| | | | |
|---|---|---|---|
| 5,450,267 A | 9/1995 | Diaz et al. | |
| 5,559,659 A | 9/1996 | Strauss | |
| 5,838,146 A | 11/1998 | Singer | |
| 5,872,378 A | 2/1999 | Rose et al. | |
| 5,956,219 A | 9/1999 | Maloney | |
| 6,249,410 B1 * | 6/2001 | Ker et al. | 361/56 |
| 6,455,902 B1 | 9/2002 | Voldman | |
| 6,552,583 B1 | 4/2003 | Kwong | |
| 6,552,886 B1 | 4/2003 | Wu et al. | |
| 6,661,273 B1 | 12/2003 | Lai et al. | |
| 6,690,561 B2 * | 2/2004 | Hung et al. | 361/111 |
| 6,927,957 B1 | 8/2005 | Bakulin | |
| 6,965,503 B2 | 11/2005 | Connor et al. | |
| 7,027,275 B2 * | 4/2006 | Smith | 361/56 |
| 7,068,482 B2 | 6/2006 | Chen | |
| 2005/0198611 A1 * | 9/2005 | Ebert et al. | 717/100 |
| 2005/0286188 A1 * | 12/2005 | Camp et al. | 361/56 |
| 2008/0106834 A1 * | 5/2008 | Hung | 361/56 |
| 2010/0157491 A1 * | 6/2010 | Hong | 361/56 |

OTHER PUBLICATIONS

U.S. Appl. No. 11/612,033 entitled "Electro-Static Discharge Protection Circuit", filed Dec. 18, 2008, First Named Inventor: John J. Ellis-Monaghan.

* cited by examiner

*Primary Examiner* — Jared Fureman
*Assistant Examiner* — Scott Bauer
(74) *Attorney, Agent, or Firm* — Scully, Scott, Murphy & Presser, P.C.; Anthony J. Canale (57) ABSTRACT

A semiconductor circuit for electric overstress (EOS) protection is provided. The semiconductor circuit employs an electrostatic discharge (ESD) protection circuit, which has a resistor-capacitor (RC) time-delay network connected to a discharge capacitor. An electronic component that has voltage snapback property or a diodic behavior is connected to alter the logic state of the gate of the discharge transistor under an EOS event. Particularly, the electronic component is configured to turn on the gate of the discharge capacitor throughout the duration of an electrical overstress (EOS) condition as well as throughout the duration of an ESD event. A design structure may be employed to design or manufacture a semiconductor circuit that provides protection against an EOS condition without time limitation, i.e., without being limited by the time constant of the RC time delay network for EOS events that last longer than 1 microsecond.

21 Claims, 8 Drawing Sheets

ELECTRICAL OVERSTRESS PROTECTION CIRCUIT

BACKGROUND

The present invention relates to a semiconductor circuit for providing protection against electrical overstress (EOS) and a design structure for the same.

An electrical overstress (EOS) event is a temporary electrical discharge in an electronic circuit that is caused by an unusual spike in the voltage applied to the electronic circuit. An EOS event causes damages at the electronic component or board level, triggering a system failure or a component failure. An EOS event usually lasts from a few microseconds to a few seconds.

When the EOS damages are at the electronic device level, such damages are typically invisible. EOS damages may be manifested, for example, as a damages metal line that is electrically open or a structure melted by high power consumption. Electrostatic discharge (ESD) events are a subset of EOS events. The ESD events have a duration less than 1 microsecond, and typically have a duration in a picoseconds range or in a nanoseconds range. Powered EOS events, i.e., EOS events in which a power source provides the source of the electrical discharge, may last over 1 millisecond, and may last up to a few seconds in duration.

An EOS event may be induced by many different causes. For example, when a plug or an electronic component is plugged into an operational electronic circuit, an EOS event may be caused by such a "hot plugging." Power supplies can cause an EOS event if they fail to regulate the power supply voltage and amperage properly and cause power spikes. Improper operating practice of electronic equipments may also cause an EOS event. Such improper operating practice includes incorrect positioning of electronic components, incomplete seating of connections, and improper power up or power down sequences. Also, ground bounce may case an EOS event. Ground bounce may be caused by turning on of a large current-consuming device, such as an electrical motor or a large electronic component. The ground bounce induces a fast current switching that results in high voltage due to insufficient grounding points. In addition, high potential device testing may cause an EOS through a voltage surge or power spike generation.

While an electrostatic discharge (ESD) protection circuit is typically employed in semiconductor devices to provide protection against ESD events that generate a voltage spike having a duration up to a microsecond or so, such an ESD protection circuit does not provide protection from a voltage spike having a duration greater than 1 microsecond. However, as electronic devices scale down for higher density and performance, the probability of EOS events having a duration greater than 1 millisecond increases.

In view of the above, there exists a need for an electrical overstress (EOS) protection circuit that provides protection against a power spike having a duration grater than 1 millisecond and up to a few seconds, and a design structure for the same.

Further, there exists a need for an EOS protection circuit that provides protection against such a power spike as well as providing protection against typical ESD events having a duration less than 1 millisecond, and a design structure for the same.

SUMMARY

The present invention enables a semiconductor circuit providing an electrical overstress (EOS) protection with an electronic component having voltage snapback property or a diodic behavior that is attached to the gate of a discharge transistor, and a design structure for the same.

In the present invention, a semiconductor circuit and a design structure for a semiconductor circuit for electric overstress (EOS) protection is provided. The semiconductor circuit employs an electrostatic discharge (ESD) protection circuit, which has a resistor-capacitor (RC) time-delay network connected to a discharge capacitor. An electronic component that has voltage snapback property or a diodic behavior is connected to alter the logic state of the gate of the discharge transistor under an EOS event. Particularly, the electronic component is configured to turn on the gate of the discharge transistor throughout the duration of an electrical overstress (EOS) condition as well as throughout the duration of an ESD event. The design structure may be employed to design or manufacture a semiconductor circuit that provides protection against an EOS condition without time limitation, i.e., without being limited by the time constant of the RC time delay network for EOS events that last longer than 1 microsecond.

According to the present invention, a design structure embodied in a machine readable medium for designing, manufacturing, or testing a design for a semiconductor structure is provided. The design structure comprises:

a first data representing a network of a resistor and a capacitor located between a power supply node and electrical ground;

a second data representing an inverter which comprises an output node at a serial connection of a drain of a p-type field effect transistor and a drain of an n-type transistor connection and an input node at a parallel connection of a gate of the p-type field effect transistor and a gate of the n-type transistor;

a third data representing a discharge transistor connected between the power supply node and electrical ground, wherein the output node of the inverter is electrically connected to a gate of the discharge transistor; and a fourth data representing an electronic component having voltage snapback property or diodic property, wherein a first end of the electronic component is connected to the power supply node or electrical ground, and wherein a second end of the electronic component is connected to the input node of the inverter or the output node of the inverter.

In one embodiment, a first end of the resistor is directly electrically connected to a first end of the capacitor, wherein a second end of the resistor is directly electrically connected to the power supply node, and wherein a second end of the capacitor is directly electrically connected to electrical ground.

In another embodiment, the first end of the electronic component may be directly electrically connected to the power supply node, and the second end of the electronic component may be directly electrically connected to the output node of the inverter. The design structure may further comprise a fifth data representing a series connection of even number of inverters directly electrically connected to the output node of the inverter at one end and the gate of the discharge transistor at another end.

In even another embodiment, the first end of the electronic component is directly electrically connected to the output node of the inverter, and wherein the second end of the electronic component is directly electrically connected to electrical ground. The first end of the resistor may be directly electrically connected to an input node of another inverter, and an output node of the other inverter may be directly electrically connected to the input node of the inverter. The design structure may further comprise a fifth data representing a set of an odd number of at least one inverter, wherein an input node of the set of the odd number of at least one inverter is directly electrically connected to the output node of the inverter, and wherein an output node of the odd number of at least one inverter is directly electrically connected to the gate of the discharge transistor.

In yet another embodiment, the first end of the electronic component is directly electrically connected to the input node of the inverter, and wherein the second end of the electronic component is directly electrically connected to electrical ground. The first end of the resistor may be directly electrically connected an input node of the inverter. The design structure may further comprise a fifth data representing a series connection of even number of inverters directly electrically connected to the output node of the inverter at one end and the gate of the discharge transistor at another end.

In still another embodiment, the fourth data represents an n-type field effect transistor (NFET) having a parasitic npn bipolar transistor across a source, a body, and a drain of the NFET, a parasitic source side resistance, and a drain side resistance, and wherein the source of the NFET is electrically shorted to a gate of the NFET.

In still yet another embodiment, the fourth data represents a non-silicided n-type field effect transistor (NFET), wherein a source of the NFET and a drain of the NFET consists of an n-doped semiconductor material and does not include a metal semiconductor alloy.

In a further embodiment, the fourth data represents a p-type field effect transistor (PFET) having a parasitic pnp bipolar transistor across a source, a body, and a drain of the PFET, a parasitic source side resistance, and a drain side resistance, and wherein the source of the PFET is electrically shorted to a gate of the PFET.

In an even further embodiment, the fourth data represents a non-silicided p-type field effect transistor (PFET), wherein a source of the PFET and a drain of the PFET consists of a p-doped semiconductor material and does not include a metal semiconductor alloy.

In a yet further embodiment, the fourth data represents a silicon controlled rectifier.

In a still further embodiment, the fourth data represents a Zener diode configured in a reverse bias mode.

In a still yet further embodiment, the fourth data represents a set of at least one diode in a series connection and in forward bias mode.

According to the present invention, a semiconductor circuit is provided, which comprises:

a network of a resistor and a capacitor located between a power supply node and electrical ground;

an inverter comprising an output node at a serial connection of a drain of a p-type field effect transistor and a drain of an n-type transistor connection and an input node at a parallel connection of a gate of the p-type field effect transistor and a gate of the n-type transistor;

a discharge transistor connected between the power supply node and electrical ground, wherein the output node of the inverter is electrically connected to a gate of the discharge transistor; and an electronic component having voltage snapback property or diodic property, wherein a first end of the electronic component is connected to the power supply node or electrical ground, and wherein a second end of the electronic component is connected to the input node of the inverter or the output node of the inverter.

DETAILED DESCRIPTION OF THE INVENTION

As stated above, the present invention relates to a semiconductor circuit for providing protection against electrical overstress (EOS) and a design structure for the same, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, one electronic component is "electrically directly connected" to another electronic component if there is no intervening electronic component therebetween and a terminal of the electronic component is connected to a terminal of the other electronic component only through a resistive wiring structure.

As used herein, "voltage snapback property" refers to a voltage-current characteristic of an electronic component that has a non-analytic discontinuous decrease in voltage with an incremental increase in current at a portion of a voltage-current curve of the electronic component. When a non-analytic discontinuous decrease in voltage occurs with an incremental increase in current, the magnitude of the change in the voltage is a finite negative number, while the magnitude of the change in the current is an infinitesimal positive number, thereby rendering the derivative of the voltage with respect to the current diverge to negative infinity, thereby rendering the voltage as a function of current "non-analytic."

Figure 1:
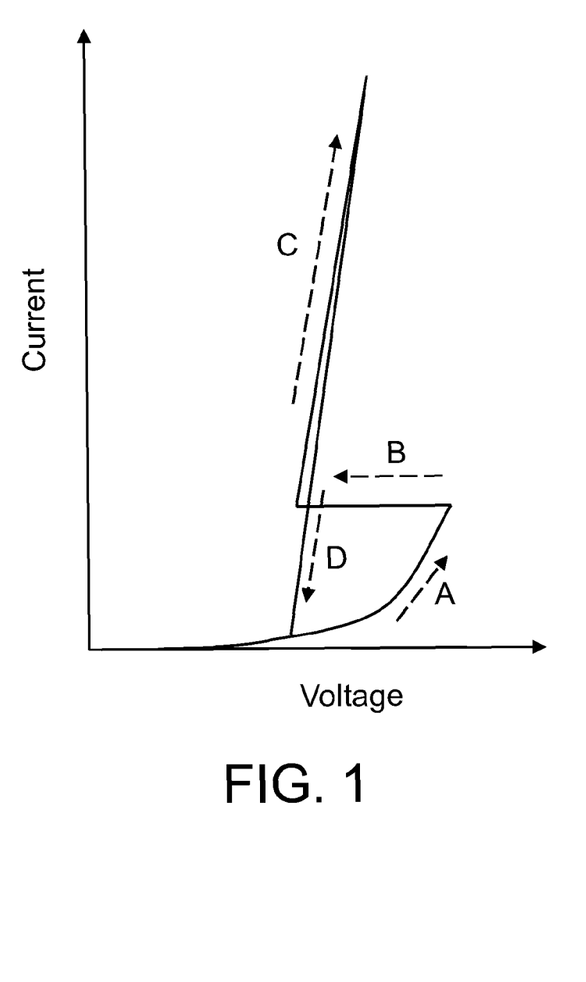
FIG. 1 is a typical voltage-current relationship for electronic components employed in the present invention and having voltage snapback property.

FIG. 1 illustrates a typical voltage-current relationship for electronic components employed in the present invention and having voltage snapback property. Initially, when the applied voltage bias across the electronic component is zero, the current through the electronic component is zero. As the voltage bias increases along the portion of the voltage-current curve that is labeled "A," the current monotonically increases with voltage, i.e., a first current corresponding to a first voltage is not less than a second current corresponding to a second voltage if the first voltage is greater than the second voltage. Typically, once a finite amount of current flows, the current strictly increases with voltage, i.e., a first current corresponding to a first voltage is greater than a second current corresponding to a second voltage if the first voltage is greater than the second voltage. Once the voltage reaches a "snapback voltage" at the end of the portion of the voltage-current curve labeled "A," a "voltage snapback" occurs, i.e., the voltage across the electronic component decreases instantaneously, while the current remains the same or increases. This change is represented by the portion of the voltage-current curve that is labeled "B." The voltage snapback is instantaneous, e.g., occurs on a microsecond time scale or less. Once the voltage snapback occurs, the electronic device follows a different type of voltage-current curve, which is labeled "C" and "D" and are distinct from the portion of the voltage-current curve that is labeled "A."

Exemplary electronic devices that exhibit such voltage snapback property include a silicon controlled rectifier (SCR), an n-type field effect transistor (NFET) having a non-metallized source, a non-metallized drain, and a gate that is shorted to the source, and a p-type field effect transistor (PFET) having a non-metallized source, a non-metallized drain, and a gate that is shorted to the source. In the case of the PFET or NFET having a non-metallized source, a non-metallized drain, and a gate that is shorted to the source, the source and drain consists of doped semiconductor material and does not include any metal semiconductor alloy such as a metal silicide. Lack of any metal silicide alloy increases the resistance of the source and drain. In combination with a parasitic bipolar transistor that is inherently present in field effect transistors, the source and drain having a relatively high resistance may induce voltage snapback property in the PFET or the NFET having the non-metallized source and drain.

As used herein, "diodic property" refers to a voltage-current characteristic of an electronic component that displays an exponential increase in current with a forward bias voltage as in a normal diode and/or a breakdown characteristic in current with a reverse bias voltage as in a Zener diode. An electronic component with diodic property "clamps" the voltage across the electronic component at the voltage of triggering of the exponential increase in current or at the breakdown voltage in the case of a Zener diode.

Figure 2:
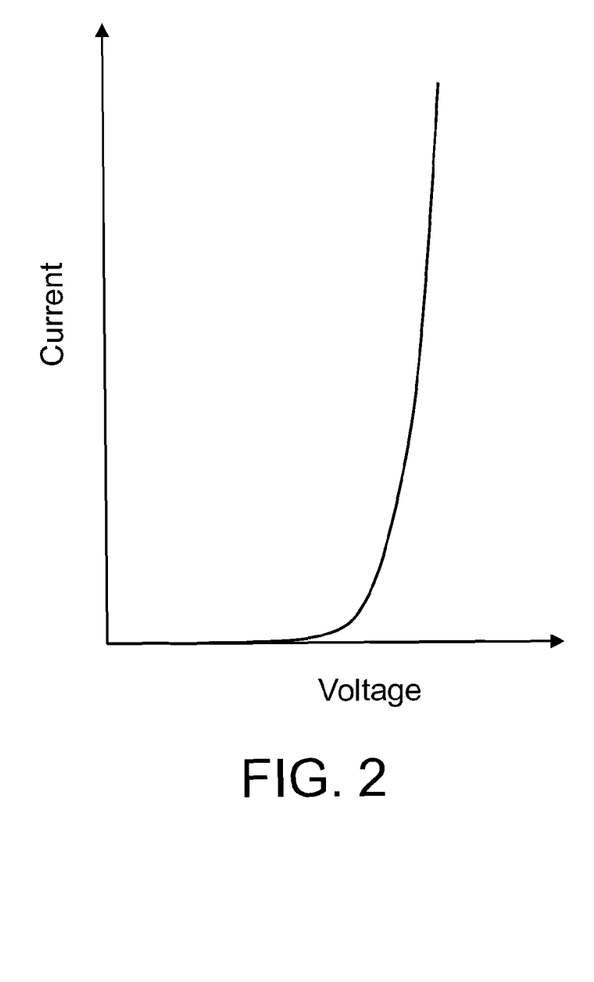
FIG. 2 is a typical voltage-current relationship for electronic components employed in the present invention and having diodic property.

FIG. 2 illustrates a typical voltage-current relationship for electronic components employed in the present invention and having diodic property. Exemplary electronic devices that exhibit such diodic property include p-n junction diodes, p-type/intrinsic/n-type (PIN) diodes, and Zener diodes.

Figure 3:
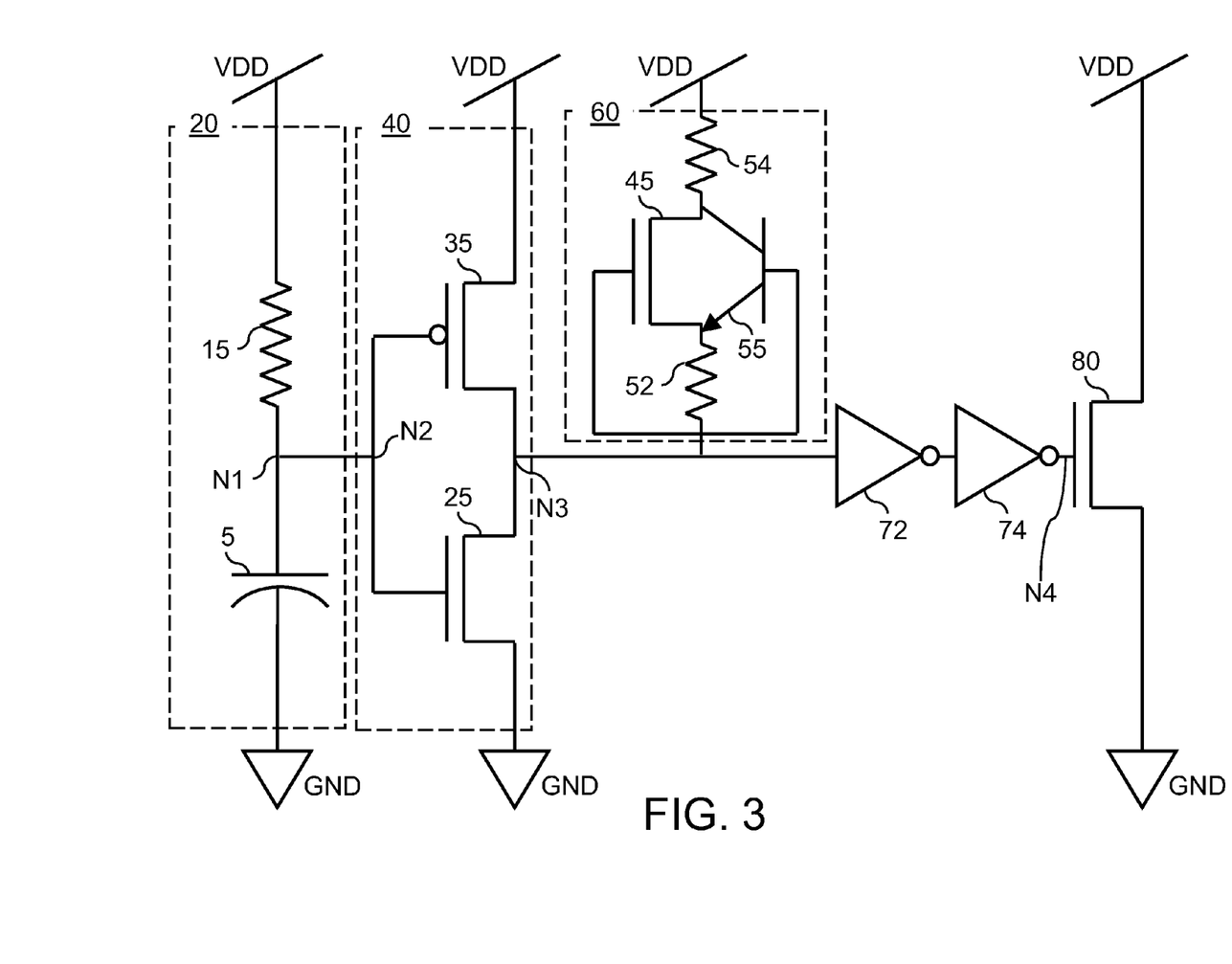
FIG. 3 is a first exemplary semiconductor circuit according to a first embodiment of the present invention.

Referring to FIG. 3, a first exemplary semiconductor circuit according to a first embodiment of the present invention comprises a resistor-capacitor (RC) network 20, a first inverter 40, an electronic component 60, a second inverter 72, a third inverter 74, and a discharge transistor 80. The output node of the RC network 20 is directly electrically connected to the input node of the first inverter 40. The output node of the first inverter 40 is directly electrically connected to the electronic component 60 and the input node of the second inverter 72. The output node of the second inverter 72 is directly electrically connected to the input stage of the third inverter 74. The output node of the third inverter 74 is directly electrically connected to the gate of a discharge transistor 80, which is an n-type field effect transistor.

The RC network 20 comprises a series connection of a resistor 15 and a capacitor 5. A first end of the resistor 15 and a first end of the capacitor 5 are directly electrically connected to form a first node N1, which is the output node of the RC network 20. A second end of the resistor 15 is directly electrically connected to a power supply node, which is labeled "VDD." A second end of the capacitor 5 is directly electrically connected to electrical ground, which is labeled "GND."

The first inverter 40 comprises a p-type field effect transistor (PFET) 35 and an n-type field effect transistor (NFET) 25. The gate of the PFET 35 and the gate of the NFET 25 are directly electrically connected to form a parallel connection between the RC network 20 and the first inverter 40 to provide an input signal to the first inverter 40. The input node of the first inverter 40 is herein referred to as a second node N2, and is identical to the first node N1, which is the output node of the RC network 20. The drain of the PFET 35 and the drain of the NFET 25 are directly electrically connected in a series connection between the power supply node VDD and electrical ground GND to form an output node of the first inverter 40. The output node of the first inverter is herein referred to as a third node N3.

The electronic component 60 is a two terminal semiconductor device having voltage snapback property or diodic property. A first end of the electronic component 60 is directly electrically connected to the power supply node VDD, and the second end of the electronic component 60 is connected to the third node N3, which is the output node of the first inverter 40.

In one case, the electronic component 60 may comprise a two terminal semiconductor device having voltage snapback property. For example, the electronic component 60 may be a silicon controlled rectifier (SCR), an n-type field effect transistor (NFET) having a non-metallized source, a non-metallized drain, and a gate that is shorted to the source, and a p-type field effect transistor (PFET) having a non-metallized source, a non-metallized drain, and a gate that is shorted to the source. In another case, the electronic component 60 may comprise a two terminal semiconductor device having diodic property. For example, the electronic component 60 may be a p-n junction diode, a p-type/intrinsic/n-type (PIN) diode, a Zener diode, or a combination or a stack thereof.

For example, the electronic component 60 may be an n-type field effect transistor (NFET) having a non-metallized source, a non-metallized drain, and a gate that is shorted to the source. The electrical characteristics of the NFET may be described by explicitly illustrating parasitic components that are inherently present in the NFET. In this case, the electronic component 60 comprises an ideal NFET 45, a parasitic source resistor 52, a parasitic drain resistor 54, and a parasitic npn bipolar transistor 55. The parasitic source resistor 52 represents the resistance of the source of the NFET, and the parasitic drain resistor 54 represents the resistance of the drain of the NFET. The emitter, base, and collector of the parasitic npn bipolar transistor are the source, the body, and the drain, respectively, of the NFET.

In a preferred embodiment, the NFET is a non-metallized NFET, i.e., an NFET having a non-metallized source and a non-metallized drain. Thus, the source of the NFET and the drain of the NFET consist of an n-doped semiconductor such as n-doped single crystalline silicon. The source and the drain of the NFET are free of a metal semiconductor alloy such as a metal silicide.

Typically, the source and the drain of a field effect transistor is metallized to decrease the parasitic source resistance and the parasitic drain resistance. In the present invention, the source resistance and the drain resistance is intentionally kept above the level of a metallized source or a metallized drain to increase the parasitic source resistance or the parasitic drain resistance. By preventing metallization, the non-metallized source and the non-metallized drain of the NFET have the benefit of providing voltage snapback property without inducing a device failure. In other words, the non-metallized source and the non-metallized drain enable a voltage snapback, or a sudden reduction, of the potential difference between the source and the drain of the NFET after the current though the NFET reaches a critical point. Once the NFET turns on, the ideal NFET 45 and the parasitic npn bipolar transistor 55 are locked into an "on" mode until the current through the NFET decreases to a level that is low enough to turn off the NFET.

The serial connection of the second inverter 72 and the third inverter 74 functions as a buffer for signal amplification and stabilization and as a signal delay mechanism, which introduces a signal delay corresponding to logic stages. Such signal delay time may be from about 1 ps to about 100 ps per inverter. The serial connection of the second inverter 72 and the third inverter 74 may be replaced with a series connection of any even number of inverters that is directly connected to the third node N3, which is the output node of the first inverter 40, at one end and to the gate of the discharge transistor 80 at another end. The gate of the discharge transistor 80 is the input node of the discharge transistor, and is herein referred to as a fourth node N4. Alternatively, the serial connection of the second inverter 72 and the third inverter 74 may be omitted and the output node of the first inverter 40 may be connected directly to the gate of the discharge transistor 80.

The discharge transistor 80 may be an n-type field effect transistor having a sufficient width to discharge enough current during an electrical overstress (EOS) event to protect a semiconductor device circuit (not shown) containing logic or memory devices and attached to the semiconductor circuit in a parallel connection. The width of the discharge transistor 80 depends on the current handling capability of the discharge transistor, which depends on the level of protection to be provided to the semiconductor device circuit. For example, the discharge transistor 80 may be configured to pass a current from about 1 mA to about 10 A.

Alternatively, a p-type field effect transistor (PFET) may be employed as a discharge transistor. In this case, a series connection of an odd number of at least one inverter replaces the serial connection of the second inverter 72 and the third inverter 74. In other words, an odd number of at least one inverter is provided between the third node N3 and the fourth node N4 if the PFET replaces the NFET for the discharge transistor 80.

In the normal state of the semiconductor circuit in the absence of an electrostatic discharge (ESD) event or another type of electrical overstress (EOS) event, the first node N1 is held high at the potential of the supply voltage node VDD because of the capacitor 5. The second node N2 is also held high since the logical state of the second node N2 is identical to the logical state of the first node N1. The third node N3 is held low since output from the first inverter 40 is the opposite of the input into the first inverter 40. After the series of the second and third inverters (72, 74), the fourth node N4 is held low, thereby turning off the discharge transistor 80. The power supply node VDD is electrically isolated from electrical ground VDD and the power supply voltage is supplied to the rest of the circuit, i.e., to the semiconductor device circuit normally.

During an ESD event, the RC network 20 divides the voltage spike having a duration less than about 1 microsecond. Since the capacitor 5 has a low impedance for high frequency electrical signals such as the voltage spike of the ESD event, while the resistor 15 has a frequency independent impedance, the voltage at the first node N1 drops and the state of the first node N1 changes to a low state. The second node N2 is also changed to a low state. The third node N3 is held high since output from the first inverter 40 is the opposite of the input into the first inverter 40. After the series of the second and third inverters (72, 74), the fourth node N4 is held high, thereby turning on the discharge transistor 80. The power supply node VDD is electrically connected to electrical ground VDD, thereby allowing discharge of the instantaneous electrical charges that are present in the power supply node VDD. Once the ESD event passes, the voltage at the first node N1 changes back to a voltage close to the power supply voltage provided by the power supply node VDD.

During an EOS event that occurs more slowly than an ESD event, e.g., over a time scale that exceeds 1 µs, the frequency of voltage spike decreases. In such cases, the impedance of the capacitor 5 increases, and the voltage drop at the first node is less in magnitude. In the absence of the electronic component 60, once the decrease in the voltage at the first node N1 becomes insufficient to change the output of the first inverter 40 to high, the discharge capacitor 80 would never turn on. The presence of the electronic component 60 having voltage snapback property or diodic property, however, triggers a turn-on of the discharge capacitor 80. The voltage at the third node N3 is normally low, i.e., close to electrical ground.

In case the electronic component 60 has voltage snapback property, as the voltage across the electronic component 60 reaches a snapback voltage at which the electronic component 60 snaps back and "turns on" to allow passing of a large amount of current through the electronic component 60. Once a snapback occurs in the electronic component 60, the current that passes through the electronic component 60 passes through the NFET 25 of the first inverter 40. Thus, electronic component 60 and the NFET 25 of the first inverter 40 function as a voltage divider. The impedance of the NFET 25 in an on-state and the impedance of the electronic component 60 in a snapback mode are selected such that the logical state of the third node N3 becomes high. In other words, the impedance of the NFET 25 of the first inverter 40 is sufficiently high relative to the impedance of the electronic component 60 in the snapback mode so that the voltage at the third node N3 reaches the minimum threshold voltage required to set the logical state of the third node N3 to "high." After the series connection of the second and third inverters (72, 74), the voltage at the fourth node N4, i.e., the voltage at the gate of the discharge transistor 80 is set at a high level, thereby turning on the discharge transistor 80.

Unlike the RC network 20, which has a built in time constant of the product of the resistance of the resistor 15 and the capacitance of the capacitor 5, the mechanism that is employed to turn on the electronic component 60 with voltage snapback property does not have any time constant. Thus, as long as the condition for the EOS event continues, the electronic component 60 remains in the snapback mode and the discharge transistor 80 is turned on indefinitely. The discharge transistor 80 turns off only when the EOS event ends and the current supply from the source of the EOS event decreases to a level to turn off the electronic component 60. This way, the semiconductor circuit of FIG. 3 provides protection against an EOS event.

The snapback voltage, or the voltage at which the electronic component 60 with voltage snapback property switches from a normal high impedance mode to a snapback mode, or a low impedance mode, is selected to be greater than the normal power supply voltage at the power supply node VDD. The snapback voltage of the electronic component 60 is the trigger voltage of the semiconductor circuit of FIG. 3.

In case the electronic component 60 has diodic property, as the voltage across the electronic component 60 reaches a turn-on voltage in the case of at least one diode in forward bias mode or a breakdown voltage in the case of a Zener diode, the electronic component 60 turns on and clamps the voltage across the electronic component 60 at the turn-on voltage or at the breakdown voltage, while passing of a large amount of current through the electronic component 60. Once the electronic component 60 turns on, the current that passes through the electronic component 60 passes through the NFET 25 of the first inverter 40. The difference between the voltage at the power supply node VDD, which is abnormally high during the EOS event, and the voltage consumed across the electronic component 60 is applied to the input node of the second inverter 72 and across the NFET 25 of the first inverter 40. The logical state of the third node N3 is set to high. After the series connection of the second and third inverters (72, 74), the voltage at the fourth node N4, i.e., the voltage at the gate of the discharge transistor 80 is set at a high level, thereby turning on the discharge transistor 80.

The mechanism that is employed to turn on the electronic component 60 with diodic property does not have any time constant. Thus, as long as the condition for the EOS event continues, the electronic component remains clamped at the turn-on voltage or at the breakdown voltage and the discharge transistor 80 is turned on indefinitely. The discharge transistor 80 turns off only when the EOS event ends and the current supply from the source of the EOS event decreases to a level to change the state of the third node N3 to a low state. This way, the semiconductor circuit of FIG. 3 provides protection against an EOS event.

The turn-on voltage or the breakdown voltage of the electronic component 60 with diodic property is selected to be greater than the normal power supply voltage at the power supply node VDD. The turn-on voltage or the breakdown voltage of the electronic component 60 is the trigger voltage of the semiconductor circuit of FIG. 3.

Figure 4:
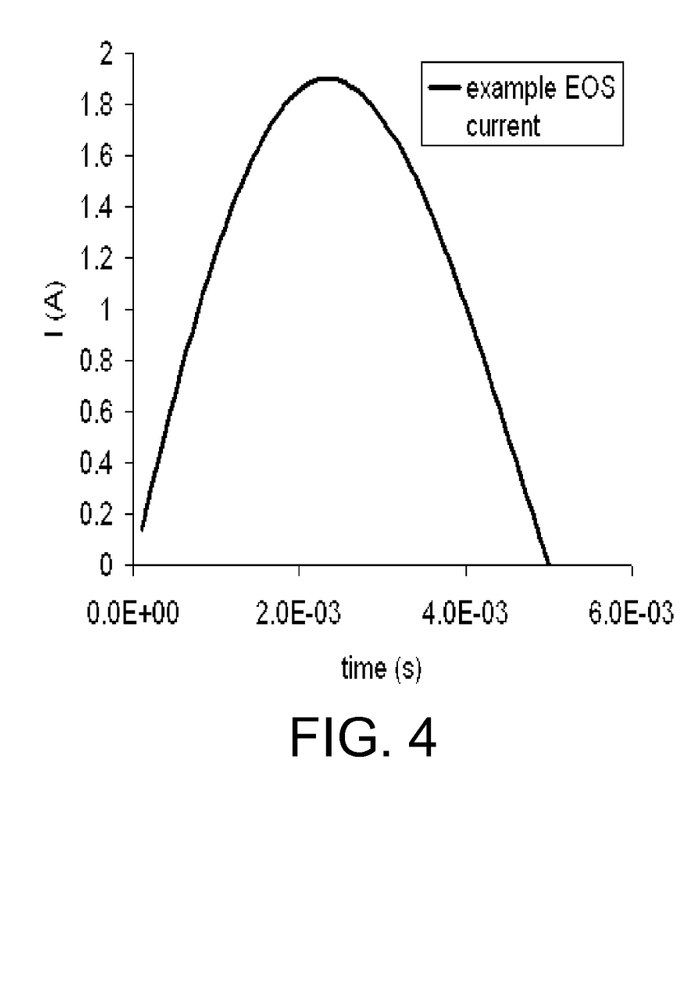
FIG. 4 is a simulation result for electrical overstress (EOS) current from the first exemplary semiconductor circuit of the present invention.
Figure 5:
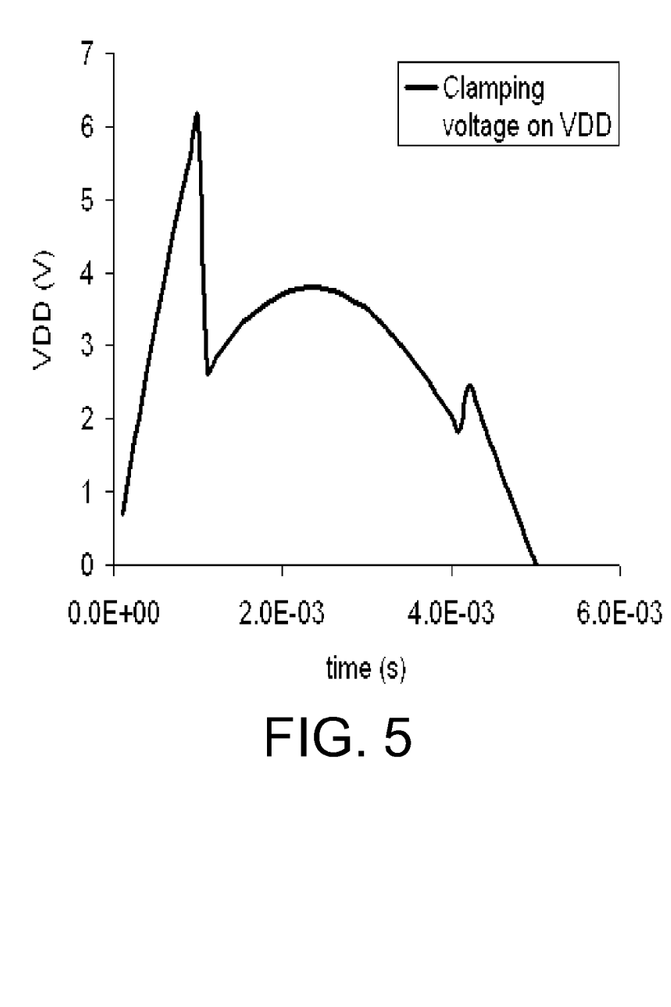
FIG. 5 is a simulation result for clamping voltage on a power supply voltage (VDD) from the first exemplary semiconductor circuit of the present invention.

Referring to FIGS. 4 and 5, a simulation result for electrical overstress (EOS) current from the first exemplary semiconductor circuit of the present invention is shown in FIG. 4, and a matching simulation result for clamping voltage on a power supply voltage (VDD) from the first exemplary semiconductor circuit of the present invention is shown in FIG. 5. The duration of the EOS event in this case is about 5 milliseconds. When the voltage at the power supply node VDD reaches about 6 V in about 1 millisecond into the EOS event, an electronic component 60 (See FIG. 3) with a voltage snapback property turns on so that a discharge transistor 80 discharges the extra charge in the power supply node VDD. An n-type field effect transistor is employed as the electronic component in this simulation. The electronic component 60 turns off when the power supply node VDD reaches about 2 V in about 4 milliseconds into the EOS event. The electronic component 60 triggers a turn-on of the discharge transistor 80 between 1 millisecond and 4 milliseconds into the EOS event, thereby reducing the voltage at the power supply node VDD and protecting a semiconductor device circuit that shares the power supply node VDD with the EOS protection circuit of the first embodiment of the present invention.

Figure 6:
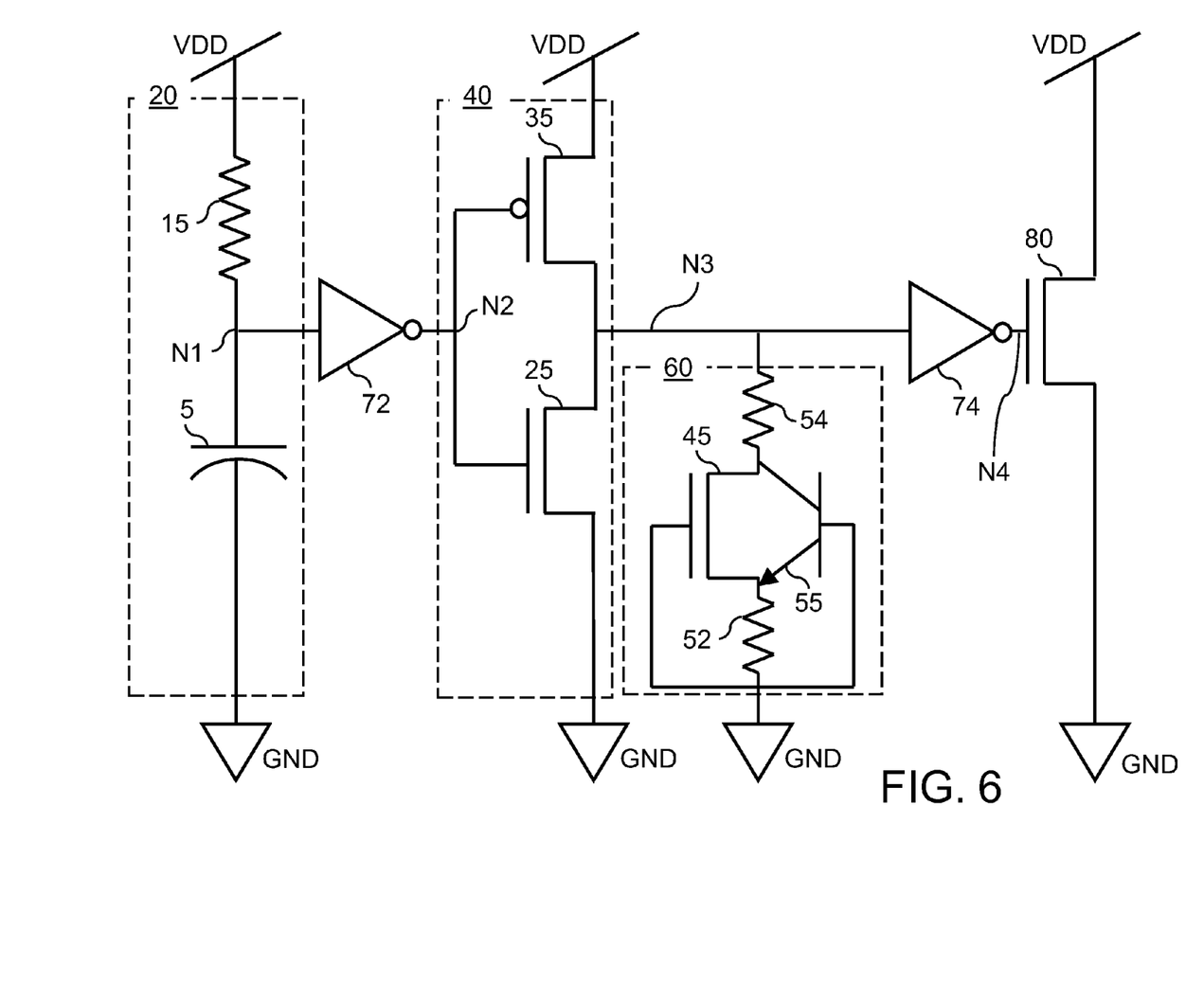
FIG. 6 is a second exemplary semiconductor circuit according to a second embodiment of the present invention.

Referring to FIG. 6, a second exemplary semiconductor circuit according to a second embodiment of the present invention comprises a resistor-capacitor (RC) network 20, a first inverter 40, an electronic component 60, a second inverter 72, a third inverter 74, and a discharge transistor 80 as in the first embodiment. The output node of the RC network 20 is directly electrically connected to the input node of the second inverter 72. The output node of the second inverter 72 is directly electrically connected to the input node of the first inverter 40. The output node of the first inverter 40 is directly electrically connected to the electronic component 60 and the input node of the third inverter 74. The output node of the third inverter 74 is directly electrically connected to the gate of a discharge transistor 80, which is an n-type field effect transistor.

The RC network 20 comprises a series connection of a resistor 15 and a capacitor 5. A first end of the resistor 15 and a first end of the capacitor 5 are directly electrically connected to form a first node N1, which is the output node of the RC network 20. A second end of the resistor 15 is directly electrically connected to a power supply node, which is labeled "VDD." A second end of the capacitor 5 is directly electrically connected to electrical ground, which is labeled "GND."

The first node N1 is also the input node of the second inverter 72. The second inverter 72 logically inverts the input signal at the first node and provides an inverted output at an output node of the second inverter, which is also the input node of the first inverter 40. The input node of the first inverter is a second node N2. The second node N2 has an opposite logical state than the first node N1.

The first inverter 40 comprises a p-type field effect transistor (PFET) 35 and an n-type field effect transistor (NFET) 25. The gate of the PFET 35 and the gate of the NFET 25 are directly electrically connected to form a parallel connection between the second inverter 72 and the first inverter 40 to provide an input signal to the first inverter 40. The drain of the PFET 35 and the drain of the NFET 25 are directly electrically connected in a series connection between the power supply node VDD and electrical ground GND to form an output node of the first inverter 40. The output node of the first inverter is herein referred to as a third node N3.

The electronic component 60 is a two terminal semiconductor device having voltage snapback property or diodic property. A first end of the electronic component 60 is directly electrically connected to third node N3, i.e., the output node of the first inverter 40, and the second end of the electronic component 60 is connected to electrical ground GND.

As in the first embodiment, the electronic component 60 may comprise a two terminal semiconductor device having voltage snapback property or comprise a two terminal semiconductor device having diodic property. The electronic component 60 may be a silicon controlled rectifier (SCR), an n-type field effect transistor (NFET) having a non-metallized source, a non-metallized drain, and a gate that is shorted to the source, and a p-type field effect transistor (PFET) having a non-metallized source, a non-metallized drain, and a gate that is shorted to the source. Alternately, the electronic component 60 may be a p-n junction diode, a p-type/intrinsic/n-type (PIN) diode, a Zener diode, or a combination or a stack thereof.

For example, the electronic component 60 may be an n-type field effect transistor (NFET) having a non-metallized source, a non-metallized drain, and a gate that is shorted to the source. The electrical characteristics of the NFET may be described by explicitly illustrating parasitic components that are inherently present in the NFET. In this case, the electronic component 60 comprises an ideal NFET 45, a parasitic source resistor 52, a parasitic drain resistor 54, and a parasitic npn bipolar transistor 55. The parasitic source resistor 52 represents the resistance of the source of the NFET, and the parasitic drain resistor 54 represents the resistance of the drain of the NFET. The emitter, base, and collector of the parasitic npn bipolar transistor are the source, the body, and the drain, respectively, of the NFET.

The electronic component 60 may have the same subcomponents as in the first embodiment. Further, the structure an functionality of the electronic component 60 may be the same as in the first embodiment.

The third inverter 74 functions as an inverting buffer for signal amplification and stabilization and as a signal delay mechanism, which introduces a signal delay corresponding to logic stages. The third inverter 74 may be replaced with a series connection of any odd number of inverters that is directly connected to the third node N3, which is the output node of the first inverter 40, at one end and to the gate of the discharge transistor 80 at another end. The gate of the discharge transistor 80 is the input node of the discharge transistor, and is a fourth node N4.

The discharge transistor 80 may be an n-type field effect transistor having a sufficient width to discharge enough current during an electrical overstress (EOS) event to protect a semiconductor device circuit (not shown) containing logic or memory devices and attached to the semiconductor circuit in a parallel connection. The width of the discharge transistor 80 depends on the current handling capability of the discharge transistor, which depends on the level of protection to be provided to the semiconductor device circuit. For example, the discharge transistor 80 may be configured to pass a current from about 1 mA to about 10 A.

Alternatively, a p-type field effect transistor (PFET) may be employed as a discharge transistor. In this case, a series connection of an even number of inverters replaces the third inverter 74. In other words, an even number of at least one inverter is provided between the third node N3 and the fourth node N4 if the PFET is employed instead of an NFET for the discharge capacitor. Alternately, the third node N3 may be electrically directly connected to the fourth node N4.

In the normal state of the semiconductor circuit in the absence of an electrostatic discharge (ESD) event or another type of electrical overstress (EOS) event, the first node N1 is held high at the potential of the supply voltage node VDD because of the capacitor 5. The second node N2 is held low since the logical state of the second node N2 is the opposite of the logical state of the first node N1. The third node N3 is held high since output from the first inverter 40 is the opposite of the input into the first inverter 40. After the third inverter 74, the fourth node N4 is held low, thereby turning off the discharge transistor 80. The power supply node VDD is electrically isolated from electrical ground VDD and the power supply voltage is supplied to the rest of the circuit, i.e., to the semiconductor device circuit normally.

During an ESD event, the RC network 20 divides the voltage spike having a duration less than about 1 microsecond. Since the capacitor 5 has a low impedance for high frequency electrical signals such as the voltage spike of the ESD event, while the resistor 15 has a frequency independent impedance, the voltage at the first node N1 drops and the state of the first node N1 changes to a low state. The second node N2 is changed to a high state. The third node N3 is held low since output from the first inverter 40 is the opposite of the input into the first inverter 40. After the third inverter 74, the fourth node N4 is held high, thereby turning on the discharge transistor 80. The power supply node VDD is electrically connected to electrical ground VDD, thereby allowing discharge of the instantaneous electrical charges that are present in the power supply node VDD. Once the ESD event passes, the voltage at the first node N1 changes back to a voltage close to the power supply voltage provided by the power supply node VDD.

During an EOS event that occurs more slowly than an ESD event, e.g., over a time scale that exceeds 1 µs, the frequency of voltage spike decreases. In such cases, the impedance of the capacitor 5 increases, and the voltage drop at the first node is less in magnitude. In the absence of the electronic component 60, once the decrease in the voltage at the first node N1 is insufficient to change the output of the first inverter 40 to high, the discharge capacitor 80 would never turn on. The presence of the electronic component 60 having voltage snapback property or diodic property, however, triggers a turn-on of the discharge capacitor 80. The voltage at the third node N3 is normally low, i.e., close to electrical ground.

In case the electronic component 60 has voltage snapback property, the nominally "high" voltage at the third node N3 increases under an EOS event since the PFET 35 and the NFET 25 of the first inverter 40 functions as a voltage divider. The increase in the actual voltage at the third node N3 tracks the increase in the voltage spike at the power supply node VDD. Thus, the voltage at the third node N3 increases to an abnormally high level, i.e., a level higher than a usual high level under a normal power supply voltage condition, when an EOS event occurs and the voltage at the power supply node VDD rises above the level of the normal power supply voltage. Once the voltage across the electronic component 60 reaches a snapback voltage at which the electronic component 60 snaps back and "turns on," the electronic component 60 provides a conductive path in a parallel connection with the NFET 25 of the first inverter 40. Electrical current flows through the PFET 35 in the first inverter 40 and the electronic component 60. The PFET 35 in the first inverter 40 and the electronic component 60 function as a voltage divider. The impedance of the PFET 35 in an on-state and the impedance of the electronic component 60 in a snapback mode are selected such that the logical state of the third node N3 becomes low. In other words, the impedance of the PFET 35 of the first inverter 40 is sufficiently high relative to the impedance of the electronic component 60 in the snapback mode so that the voltage at the third node N3 falls below a maximum threshold voltage required to set the logical state of the third node N3 to "low." After the third inverter 74, the voltage at the fourth node N4, i.e., the voltage at the gate of the discharge transistor 80 is set at a high level, thereby turning on the discharge transistor 80.

Unlike the RC network 20, which has a built in time constant of the product of the resistance of the resistor 15 and the capacitance of the capacitor 5, the mechanism that is employed to turn on the electronic component 60 with voltage snapback property does not have any time constant. Thus, as long as the condition for the EOS event continues, the electronic component 60 remains in the snapback mode and the discharge transistor 80 is turned on indefinitely. The discharge transistor 80 turns off only when the EOS event ends and the current supply from the source of the EOS event decreases to a level to turn off the electronic component 60. This way, the semiconductor circuit of FIG. 6 provides protection against an EOS event.

The snapback voltage, or the voltage at which the electronic component 60 with voltage snapback property switches from a normal high impedance mode to a snapback mode, or a low impedance mode, is selected to be greater than the normal "high" output of the first inverter 40 under normal power supply voltage at the power supply node VDD. The trigger voltage of the semiconductor circuit of FIG. 6 may be greater than the snapback voltage of the electronic component 60 by the voltage differential across the PFET 35 while the PFET 35 is turned on.

In case the electronic component 60 has diodic property, as the voltage across the electronic component 60 reaches a turn-on voltage in the case of at least one diode in forward bias mode or a breakdown voltage in the case of a Zener diode, the electronic component 60 turns on and clamps the voltage across the electronic component 60 at the turn-on voltage or at the breakdown voltage, while passing of a large amount of current through the electronic component 60. Thus, the voltage at the third node N3 is clamped at the turn-on voltage or at the breakdown voltage of the electronic component 60. The power supply voltage to the third inverter 74, however, is determined by the voltage of the power supply node VDD since the third inverter is powered by the same power supply node VDD. As the power supply voltage to the third inverter 74 increases, the clamped voltage at the third node N3 is not high enough relative to the power supply voltage of the third inverter to maintain the fourth node N4 low. Under such a condition, the fourth node N4 becomes "high" and the discharge transistor 80 turns on.

The mechanism that is employed to turn on the electronic component 60 with diodic property does not have any time constant. Thus, as long as the condition for the EOS event continues, the electronic component remains clamped at the turn-on voltage or at the breakdown voltage and the discharge transistor 80 is turned on indefinitely. The discharge transistor 80 turns off only when the EOS event ends and the current supply from the source of the EOS event decreases to a level to change the state of the third node N3 to a low state. This way, the semiconductor circuit of FIG. 6 provides protection against an EOS event.

The turn-on voltage or the breakdown voltage of the electronic component 60 with diodic property is selected to be greater than the normal "high" output of the first inverter 40 under normal power supply voltage at the power supply node VDD. The trigger voltage of the semiconductor circuit of FIG. 6 may be greater than the turn-on voltage or the breakdown voltage of the electronic component 60 by the voltage differential across the PFET 35 while the PFET 35 is turned on.

Figure 7:
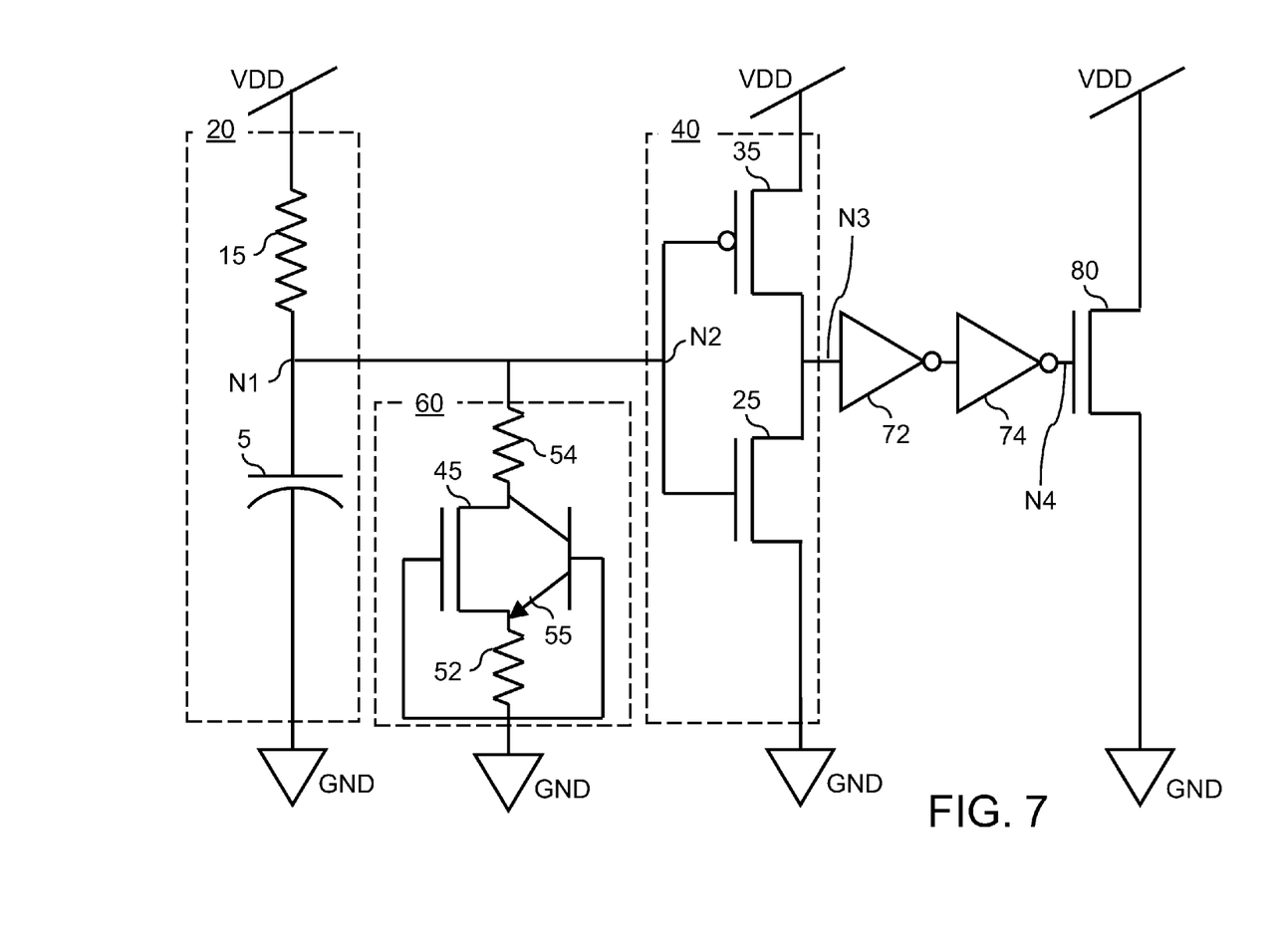
FIG. 7 is a third exemplary semiconductor circuit according to a third embodiment of the present invention.

Referring to FIG. 7, a third exemplary semiconductor circuit according to a third embodiment of the present invention comprises a resistor-capacitor (RC) network 20, a first inverter 40, an electronic component 60, a second inverter 72, a third inverter 74, and a discharge transistor 80 as in the first embodiment. The output node of the RC network 20 is directly electrically connected to the input node of the first inverter 40. Further, the output node of the RC network is directly electrically connected to the electronic component 60. The output node of the first inverter 40 is directly electrically connected to the input node of a series of the second inverter 72 and the third inverter 74. The output node of the third inverter 74 is directly electrically connected to the gate of a discharge transistor 80, which is an n-type field effect transistor.

The RC network 20 comprises a series connection of a resistor 15 and a capacitor 5. A first end of the resistor 15 and a first end of the capacitor 5 are directly electrically connected to form a first node N1, which is the output node of the RC network 20. A second end of the resistor 15 is directly electrically connected to a power supply node, which is labeled "VDD." A second end of the capacitor 5 is directly electrically connected to electrical ground, which is labeled "GND."

The first inverter 40 comprises a p-type field effect transistor (PFET) 35 and an n-type field effect transistor (NFET) 25. The gate of the PFET 35 and the gate of the NFET 25 are directly electrically connected to form a parallel connection between the RC network 20 and the first inverter 40 to provide an input signal to the first inverter 40. The input node of the first inverter 40 is herein referred to as a second node N2, and is identical to the first node N1, which is the output node of the RC network 20. The drain of the PFET 35 and the drain of the NFET 25 are directly electrically connected in a series connection between the power supply node VDD and electrical ground GND to form an output node of the first inverter 40. The output node of the first inverter is herein referred to as a third node N3.

The electronic component 60 is a two terminal semiconductor device having voltage snapback property or diodic property. A first end of the electronic component 60 is directly electrically connected to the first node N1, which is identical to the second node N2, and the second end of the electronic component 60 is connected to electrical ground.

As in the first and second embodiments, the electronic component 60 may comprise a two terminal semiconductor device having voltage snapback property or comprise a two terminal semiconductor device having diodic property. The electronic component 60 may be a silicon controlled rectifier (SCR), an n-type field effect transistor (NFET) having a non-metallized source, a non-metallized drain, and a gate that is shorted to the source, and a p-type field effect transistor (PFET) having a non-metallized source, a non-metallized drain, and a gate that is shorted to the source. Alternately, the electronic component 60 may be a p-n junction diode, a p-type/intrinsic/n-type (PIN) diode, a Zener diode, or a combination or a stack thereof.

For example, the electronic component 60 may be an n-type field effect transistor (NFET) having a non-metallized source, a non-metallized drain, and a gate that is shorted to the source. The electrical characteristics of the NFET may be described by explicitly illustrating parasitic components that are inherently present in the NFET. In this case, the electronic component 60 comprises an ideal NFET 45, a parasitic source resistor 52, a parasitic drain resistor 54, and a parasitic npn bipolar transistor 55. The parasitic source resistor 52 represents the resistance of the source of the NFET, and the parasitic drain resistor 54 represents the resistance of the drain of the NFET. The emitter, base, and collector of the parasitic npn bipolar transistor are the source, the body, and the drain, respectively, of the NFET.

The electronic component 60 may have the same subcomponents as in the first embodiment. Further, the structure an functionality of the electronic component 60 may be the same as in the first embodiment.

The serial connection of the second inverter 72 and the third inverter 74 functions as a buffer for signal amplification and stabilization and as a signal delay mechanism, which introduces a signal delay corresponding to logic stages. The serial connection of the second inverter 72 and the third inverter 74 may be replaced with a series connection of any even number of inverters that is directly connected to the third node N3, which is the output node of the first inverter 40, at one end and to the gate of the discharge transistor 80 at another end. The gate of the discharge transistor 80 is the input node of the discharge transistor, and is herein referred to as a fourth node N4. Alternatively, the serial connection of the second inverter 72 and the third inverter 74 may be omitted and the output node of the first inverter 40 may be connected directly to the gate of the discharge transistor 80.

The discharge transistor 80 may be an n-type field effect transistor having a sufficient width to discharge enough current during an electrical overstress (EOS) event to protect a semiconductor device circuit (not shown) containing logic or memory devices and attached to the semiconductor circuit in a parallel connection. The width of the discharge transistor 80 depends on the current handling capability of the discharge transistor, which depends on the level of protection to be provided to the semiconductor device circuit. For example, the discharge transistor 80 may be configured to pass a current from about 1 mA to about 10 A.

Alternatively, a p-type field effect transistor (PFET) may be employed as a discharge transistor. In this case, a series connection of an odd number of at least one inverter replaces the serial connection of the second inverter 72 and the third inverter 74. In other words, an odd number of at least one inverter is provided between the third node N3 and the fourth node N4 if the PFET replaces the NFET for the discharge transistor 80.

In the normal state of the semiconductor circuit in the absence of an electrostatic discharge (ESD) event or another type of electrical overstress (EOS) event, the first node N1 is held high at the potential of the supply voltage node VDD because of the capacitor 5. The second node N2 is also held high since the logical state of the second node N2 is identical to the logical state of the first node N1. The third node N3 is held low since output from the first inverter 40 is the opposite of the input into the first inverter 40. After the series of the second and third inverters (72, 74), the fourth node N4 is held low, thereby turning off the discharge transistor 80. The power supply node VDD is electrically isolated from electrical ground VDD and the power supply voltage is supplied to the rest of the circuit, i.e., to the semiconductor device circuit normally.

During an ESD event, the RC network 20 divides the voltage spike having a duration less than about 1 microsecond. Since the capacitor 5 has a low impedance for high frequency electrical signals such as the voltage spike of the ESD event, while the resistor 15 has a frequency independent impedance, the voltage at the first node N1 drops and the state of the first node N1 changes to a low state. The second node N2 is also changed to a low state. The third node N3 is held high since output from the first inverter 40 is the opposite of the input into the first inverter 40. After the series of the second and third inverters (72, 74), the fourth node N4 is held high, thereby turning on the discharge transistor 80. The power supply node VDD is electrically connected to electrical ground VDD, thereby allowing discharge of the instantaneous electrical charges that are present in the power supply node VDD. Once the ESD event passes, the voltage at the first node N1 changes back to a voltage close to the power supply voltage provided by the power supply node VDD.

During an EOS event that occurs more slowly than an ESD event, e.g., over a time scale that exceeds 1 μs, the frequency of voltage spike decreases. In such cases, the impedance of the capacitor 5 increases, and the voltage drop at the first node is less in magnitude. In the absence of the electronic component 60, once the decrease in the voltage at the first node N1 becomes insufficient to change the output of the first inverter 40 to high, the discharge capacitor 80 would never turn on. The presence of the electronic component 60 having voltage snapback property or diodic property, however, triggers a turn-on of the discharge capacitor 80. The voltage at the third node N3 is normally low, i.e., close to electrical ground.

In case the electronic component 60 has voltage snapback property, the nominally "high" voltage at the first node N1 increases under an EOS event having a duration that exceeds the RC time constant of the RC network 20 because the capacitor 5 accumulates significant amount of electrical charges as long as the time scale of the EOS event exceeds the time constant of the RC network 20. The increase in the actual voltage at the first node N1 tracks the increase in the voltage spike at the power supply node VDD. Thus, the voltage at the first node N1 increases to an abnormally high level, i.e., a level higher than a usual high level under a normal power supply voltage condition, when an EOS event occurs and the voltage at the power supply node VDD rises above the level of the normal power supply voltage. The voltage at the first node N1 is the same as the voltage differential across the electronic component 60. Once the voltage across the electronic component 60 reaches a snapback voltage at which the electronic component 60 snaps back and "turns on," the electronic component 60 provides a conductive path. Electrical current flows through the resistor 15 in the RC network 20 and the electronic component 60. The resistor 15 in the RC network 20 and the electronic component 60 function as a voltage divider. The resistance of the resistor 15 and the impedance of the electronic component 60 in a snapback mode are selected such that the logical state of the first node N3 becomes low under this condition. In other words, the resistance of the resistor 15 is sufficiently high relative to the impedance of the electronic component 60 in the snapback mode so that the voltage at the first node N1 falls below a maximum threshold voltage required to set the logical state of the first node N1 to "low." The voltage at the third node N3 is set to "high." After the series of the second inverter 72 and the third inverter 74, the voltage at the fourth node N4, i.e., the voltage at the gate of the discharge transistor 80 is set at a high level, thereby turning on the discharge transistor 80.

The snapback voltage, or the voltage at which the electronic component 60 with voltage snapback property switches from a normal high impedance mode to a snapback mode, or a low impedance mode, is selected to be greater than the normal "high" output of the RC network 20 under normal power supply voltage at the power supply node VDD. The trigger voltage of the semiconductor circuit of FIG. 6 may be substantially the same as the snapback voltage of the electronic component 60.

In case the electronic component 60 has diodic property, as the voltage across the electronic component 60 reaches a turn-on voltage in the case of at least one diode in forward bias mode or a breakdown voltage in the case of a Zener diode, the electronic component 60 turns on and clamps the voltage across the electronic component 60 at the turn-on voltage or at the breakdown voltage, while passing of a large amount of current through the electronic component 60. Thus, the voltage at the second node N2 is clamped at the turn-on voltage or at the breakdown voltage of the electronic component 60. The power supply voltage to the first inverter 40, however, is determined by the voltage of the power supply node VDD. As the power supply voltage to the first inverter 74, i.e., the voltage at the power supply node VDD, increases during the EOS event, the clamped voltage at the second node N2 is not high enough relative to the power supply voltage of the first inverter 40 to maintain the third node N3 low. Under such a condition, the third node N3 becomes "high." After the series connection of the second inverter 72 and the third inverter 74, the discharge transistor 80 turns on.

The ESD protection mechanism of the third exemplary semiconductor circuit which operates within the time scale determined by the RC time constant of the RC network 20. In contrast, the mechanism of the third exemplary semiconductor circuit operates for EOS events having a duration over a time scale that is greater than the time constant of the RC network. To turn on the electronic component 60 with voltage snapback property, the time scale of the EOS event needs to be about or greater than the time constant of the RC network 20 to enable accumulation of electrical charges across the capacitor 5. The RC network 20 and the combination of the resistor 15 and the electronic component 60 provide complimentary protection at different time scales. When the time scale of an EOS event is within the range of ESD events, the RC network 20 provides a mechanism for turning on the discharge transistor 80. When the time scale of an EOS event is greater than the time constant of the RC network 20, the combination of the resistor 15 and the electronic component provides a mechanism for turning on the discharge transistor 80.

Figure 8:
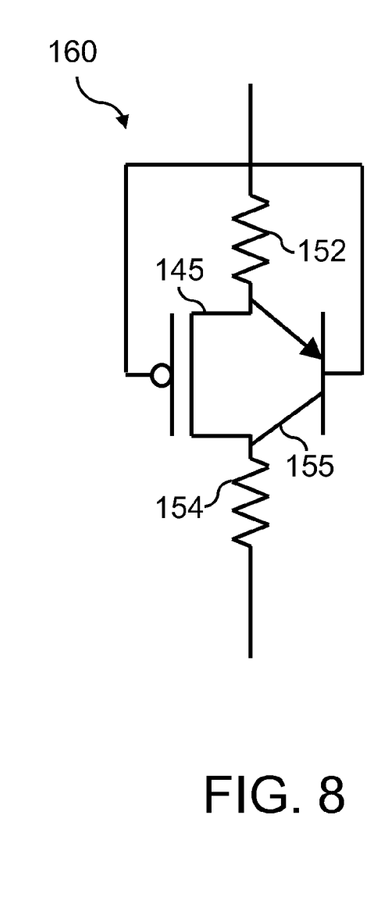
FIG. 8 is a full circuit schematic of a p-type field effect transistor (PFET) having a parasitic pnp bipolar transistor across a source, a body, and a drain of the PFET, a parasitic source side resistance, and a drain side resistance. The PFET may be employed as an electronic component having voltage snapback property. The source of the PFET is electrically shorted to a gate of the PFET.

The NFET employed as the electronic component 60 of the first, second, and third exemplary semiconductor circuits of FIGS. 3, 6, and 7 may be replaced any other electronic component having voltage snapback property or diodic property. Referring to FIG. 8, a p-type field effect transistor 160 is shown, which may be employed as the electronic component 60 of the first, second, and third exemplary semiconductor circuits of FIGS. 3, 6, and 7.

Preferably, the p-type field effect transistor (PFET) has a non-metallized source, a non-metallized drain, and a gate that is shorted to the source. The electrical characteristics of the PFET 160 may be described by explicitly illustrating parasitic components that are inherently present in the PFET 160. In this case, the electronic component 60 comprises an ideal PFET 145, a parasitic source resistor 152, a parasitic drain resistor 154, and a parasitic pnp bipolar transistor 155. The parasitic source resistor 52 represents the resistance of the source of the PFET 160, and the parasitic drain resistor 154 represents the resistance of the drain of the PFET 160. The emitter, base, and collector of the parasitic pnp bipolar transistor are the source, the body, and the drain, respectively, of the PFET 160.

In a preferred embodiment, the PFET 160 is a non-metallized PFET, i.e., a PFET having a non-metallized source and a non-metallized drain. Thus, the source of the PFET 160 and the drain of the PFET 160 consist of a p-doped semiconductor such as p-doped single crystalline silicon. The source and the drain of the PFET are free of a metal semiconductor alloy such as a metal silicide.

The source resistance and the drain resistance is intentionally kept above the level of a metallized source or a metallized drain to increase the parasitic source resistance or the parasitic drain resistance. By preventing metallization, the non-metallized source and the non-metallized drain of the PFET have the benefit of providing voltage snapback property without inducing a device failure. In other words, the non-metallized source and the non-metallized drain enable a voltage snapback of the potential difference between the source and the drain of the PFET 160 after the current though the PFET 160 reaches a critical point. Once the PFET 160 turns on, the ideal PFET 145 and the parasitic pnp bipolar transistor 155 are locked into an "on" mode until the current through the PFET 160 decreases to a level that is low enough to turn off the PFET 160.

Figure 9:
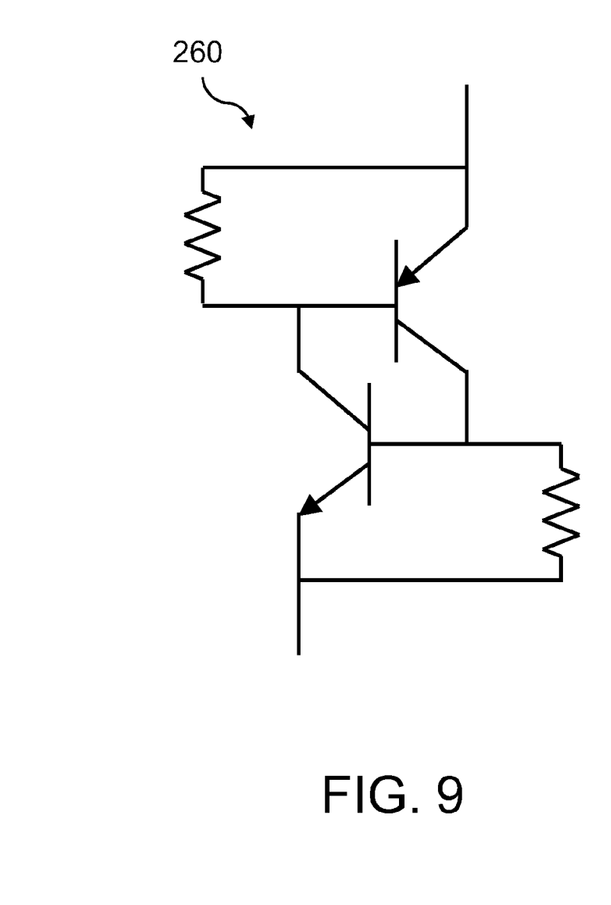
FIG. 9 is a full circuit schematic of a silicon controlled rectifier, which may be employed as an electronic component having voltage snapback property.

Referring to FIG. 9, a silicon controlled rectifier (SCR) 260 is shown, which may be employed as the electronic component 60 of the first, second, and third exemplary semiconductor circuits of FIGS. 3, 6, and 7. The electrical characteristics of the SCR 260 may be described by explicitly illustrating parasitic components that are inherently present in the SCR 260, which include a pnp transistor, an npn transistor, and two resistors. The SCR has voltage snapback property.

Figure 10:
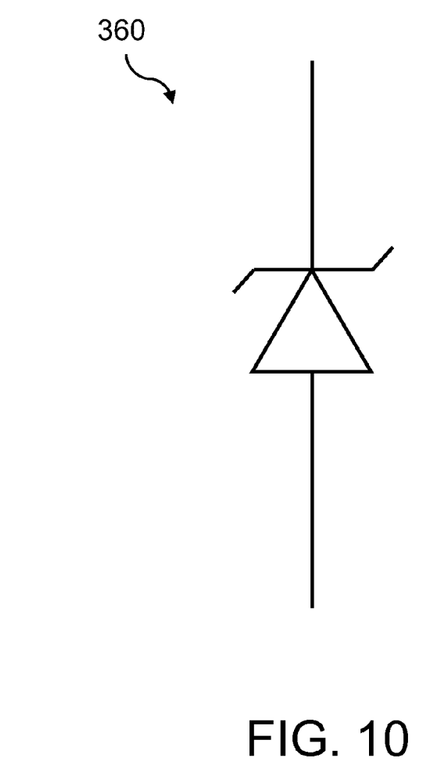
FIG. 10 is a full circuit schematic of a Zener diode configured in a reverse bias mode, which may be employed as an electronic component having diodic property.

FIG. 10 is a Zener diode 360 configured in a reverse bias mode, which may be employed as the electronic component 60 having diodic property of the first, second, and third exemplary semiconductor circuits of FIGS. 3, 6, and 7.

Figure 11:
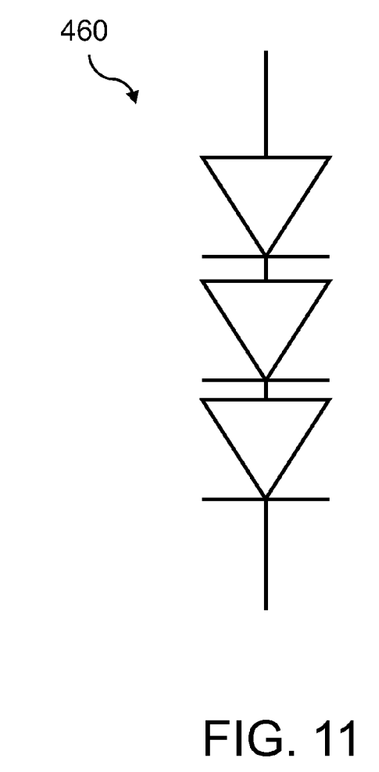
FIG. 11 is a full circuit schematic of a set of at least one diode in a series connection and in forward bias mode, which may be employed as an electronic component having diodic property.

FIG. 11 is a set of at least one diode in a series connection configured in a forward bias mode, which may be employed as the electronic component 60 having diodic property of the first, second, and third exemplary semiconductor circuits of FIGS. 3, 6, and 7.

Figure 12:
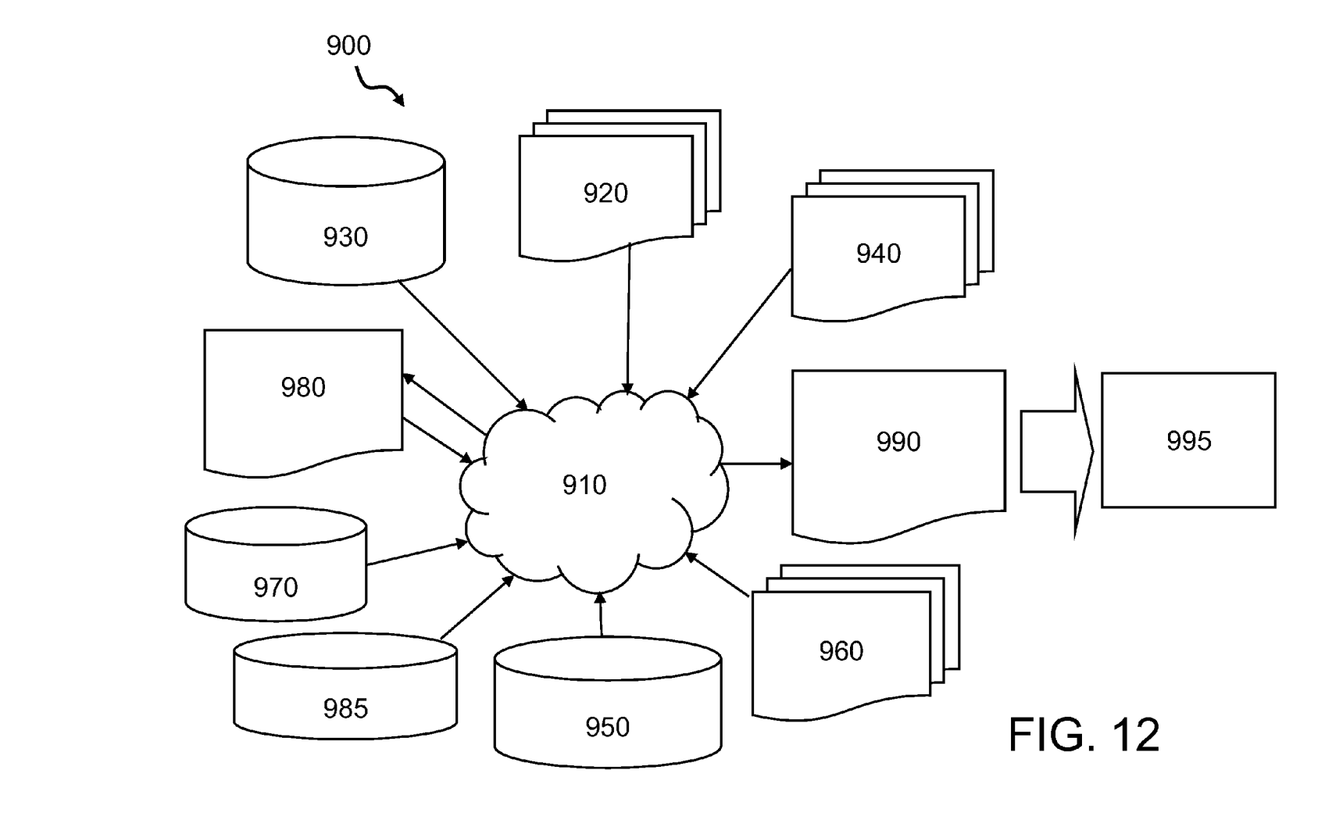
FIG. 12 is a flow diagram of a design process that may be used in design and manufacture of the semiconductor circuits according to the present invention.

FIG. 12 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 2-11. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 12 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-11 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-11. In one embodiment, design structure 990 may comprise a compiled, executable HDL simulation model that functionally simulates the devices shown in FIGS. 2-11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-11. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor circuit comprising:
   a network of a resistor and a capacitor located between a power supply node and electrical ground;
   an inverter comprising an output node at a serial connection of a drain of a p-type field effect transistor and a drain of an n-type transistor connection and an input node at a parallel connection of a gate of said p-type field effect transistor and a gate of said n-type transistor;
   a discharge transistor connected between said power supply node and electrical ground, wherein said output node of said inverter is electrically connected to a gate of said discharge transistor; and
   an electronic component having voltage snapback property or diodic property, wherein a first end of said electronic component is connected to said power supply node or electrical ground, and wherein a second end of said electronic component is connected to said input node of said inverter or said output node of said inverter, wherein said electronic component is selected from:
   an n-type field effect transistor (NFET) having a parasitic npn bipolar transistor across a source, a body, and a drain of said NFET, a parasitic source side resistance, and a drain side resistance, and wherein said source of said NFET is electrically shorted to a gate of said NFET, wherein said source of said NFET and said drain of said NFET consists of an n-doped semiconductor material and does not include a metal semiconductor alloy; and
   a p-type field effect transistor (PFET) having a parasitic pnp bipolar transistor across a source, a body, and a drain of said PFET, a parasitic source side resistance, and a drain side resistance, and wherein said source of said PFET is electrically shorted to a gate of said PFET, wherein said source of said PFET and said drain of said PFET consists of a p-doped semiconductor material and does not include a metal semiconductor alloy.

2. The semiconductor circuit of claim 1, wherein a first end of said resistor is directly connected to a first end of said capacitor, wherein a second end of said resistor is directly connected to said power supply node, and wherein a second end of said capacitor is directly connected to electrical ground.

3. The semiconductor circuit of claim 2, wherein said first end of said electronic component is directly connected to said power supply node, and wherein said second end of said electronic component is directly connected to said output node of said inverter.

4. The semiconductor circuit of claim 3, wherein said first end of said resistor is directly connected to said input node of said inverter.

5. The semiconductor circuit of claim 4, further comprising a series connection of even number of inverters directly connected to said output node of said inverter at one end and said gate of said discharge transistor at another end.

6. The semiconductor circuit of claim 4, wherein said output node of said inverter is directly connected to said gate of said discharge transistor.

7. The semiconductor structure of claim 2, wherein said first end of said electronic component is directly connected to said output node of said inverter, and wherein said second end of said electronic component is directly connected to electrical ground.

8. The semiconductor structure of claim 7, wherein said first end of said resistor is directly connected to an input node of another inverter, and wherein an output node of said other inverter is directly connected to said input node of said inverter.

9. The semiconductor structure of claim 8, further comprising a set of an odd number of at least one inverter, wherein an input node of said set of said odd number of at least one inverter is directly connected to said output node of said inverter, and wherein an output node of said odd number of at least one inverter is directly connected to said gate of said discharge transistor.

10. The semiconductor structure of claim 2, wherein said first end of said electronic component is directly connected to said input node of said inverter, and wherein said second end of said electronic component is directly connected to electrical ground.

11. The semiconductor structure of claim 10, wherein said first end of said resistor is directly connected an input node of said inverter.

12. The semiconductor circuit of claim 11, further comprising a series connection of even number of inverters directly connected to said output node of said inverter at one end and said gate of said discharge transistor at another end.

13. The semiconductor circuit of claim 11, wherein said output node of said inverter is directly connected to said gate of said discharge transistor.

14. The semiconductor circuit of claim 1, wherein said electronic component is a silicon controlled rectifier.

15. The semiconductor circuit of claim 1, wherein said electronic component is a Zener diode configured in a reverse bias mode.

16. The semiconductor circuit of claim 1, wherein said electronic component is a set of at least one diode in a series connection and in forward bias mode.

17. A design structure embodied in a non-transitory machine readable medium for designing, manufacturing, or testing a design for a semiconductor structure, said design structure comprising:

a first data representing a network of a resistor and a capacitor located between a power supply node and electrical ground;

a second data representing an inverter which comprises an output node at a serial connection of a drain of a p-type field effect transistor and a drain of an n-type transistor connection and an input node at a parallel connection of a gate of said p-type field effect transistor and a gate of said n-type transistor;

a third data representing a discharge transistor connected between said power supply node and electrical ground, wherein said output node of said inverter is electrically connected to a gate of said discharge transistor; and a fourth data representing an electronic component having voltage snapback property or diodic property, wherein a first end of said electronic component is connected to said power supply node or electrical ground, and wherein a second end of said electronic component is connected to said input node of said inverter or said output node of said inverter, wherein said electronic component is selected from:

an n-type field effect bipolar transistor across a source, a body, and a drain of said NFET, a parasitic source side resistance, and a drain side resistance, and wherein said source of said NFET is electrically shorted to a gate of said NFET, wherein said source of said NFET and said drain of said NFET consists of an n-doped semiconductor material and does not include a metal semiconductor alloy; and a p-type field effect transistor (PFET) having a parasitic pnp bipolar transistor across a source, a body, and a drain of said PFET, a parasitic source side resistance, and a drain side resistance, and wherein said source of said PFET is electrically shorted to a gate of said PFET, wherein said source of said PFET and said drain of said PFET consists of a p-doped semiconductor material and does not include a metal semiconductor alloy.

18. The design structure of claim 17, wherein a first end of said resistor is directly electrically connected to a first end of said capacitor, wherein a second end of said resistor is directly electrically connected to said power supply node, and wherein a second end of said capacitor is directly electrically connected to electrical ground.

19. The design structure of claim 18, wherein said first end of said electronic component is directly electrically connected to said power supply node, and wherein said second end of said electronic component is directly electrically connected to said output node of said inverter.

20. The design structure of claim 19, wherein said first end of said resistor is directly electrically connected to said input node of said inverter.

21. The design structure of claim 20, further comprising a fifth data representing a series connection of even number of inverters directly electrically connected to said output node of said inverter at one end and said gate of said discharge transistor at another end.

* * * * *